(12) United States Patent
Yu et al.

(10) Patent No.: US 10,014,271 B2
(45) Date of Patent: Jul. 3, 2018

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Chen-Hua Yu, Hsinchu (TW); Ming-Fa Chen, Taichung (TW); Sung-Feng Yeh, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/947,898

(22) Filed: Nov. 20, 2015

(65) Prior Publication Data

US 2017/0148756 A1    May 25, 2017

(51) Int. Cl.
| | |
|---|---|
| *H01L 23/48* | (2006.01) |
| *H01L 23/00* | (2006.01) |
| *H01L 21/78* | (2006.01) |
| *H01L 25/065* | (2006.01) |
| *H01L 25/00* | (2006.01) |

(52) U.S. Cl.
CPC ............... *H01L 24/32* (2013.01); *H01L 21/78* (2013.01); *H01L 24/83* (2013.01); *H01L 25/0657* (2013.01); *H01L 25/50* (2013.01); *H01L 2224/32235* (2013.01); *H01L 2224/83201* (2013.01); *H01L 2224/83896* (2013.01)

(58) Field of Classification Search
CPC ......... H01L 24/32; H01L 24/83; H01L 25/50; H01L 25/0657; H01L 21/78
See application file for complete search history.

(56) References Cited

U.S. PATENT DOCUMENTS

| | | | | |
|---|---|---|---|---|
| 2006/0220031 A1* | 10/2006 | Krames | ................... | H01L 33/30 257/79 |
| 2007/0202682 A1* | 8/2007 | Yamamoto | .......... | H01L 23/3114 438/612 |
| 2010/0035407 A1* | 2/2010 | Goto | ................... | H01L 27/1214 438/458 |
| 2011/0163456 A1* | 7/2011 | Miyasaka | ........... | H01L 21/6835 257/773 |
| 2012/0292730 A1* | 11/2012 | Tsai | .................... | H01L 23/5226 257/443 |

(Continued)

FOREIGN PATENT DOCUMENTS

CN            103346233 A   * 10/2013

OTHER PUBLICATIONS

CN-103346233, Oct. 2013 (machine translated document.*

*Primary Examiner* — A. Sefer
(74) *Attorney, Agent, or Firm* — WPAT, P.C., Intellectual Property Attorneys; Anthony King

(57) ABSTRACT

A semiconductor structure and a method for forming the same are provided. The method includes: providing a first semiconductor workpiece; depositing a first film on a first surface of the semiconductor workpiece; depositing a second film on a substrate that is transmissive to light within a predetermined wavelength range; and bonding the first film to the second film under a predetermined bonding temperature and a predetermined bonding pressure.

17 Claims, 11 Drawing Sheets

(56) References Cited

U.S. PATENT DOCUMENTS

| | | | |
|---|---|---|---|
| 2013/0026498 A1* | 1/2013 | Lee | H01L 33/0079 257/79 |
| 2013/0200438 A1* | 8/2013 | Liu | G01N 27/414 257/253 |
| 2013/0280848 A1* | 10/2013 | Watanabe | H01L 27/1464 438/69 |
| 2014/0232013 A1* | 8/2014 | Wu | H01L 21/76898 257/775 |
| 2014/0252691 A1* | 9/2014 | Bollaert | B29C 49/0005 264/540 |
| 2015/0091124 A1* | 4/2015 | Liu | H01L 27/1464 257/459 |
| 2015/0123284 A1* | 5/2015 | Jo | H01L 23/5384 257/774 |

* cited by examiner

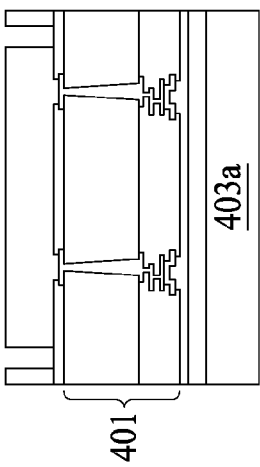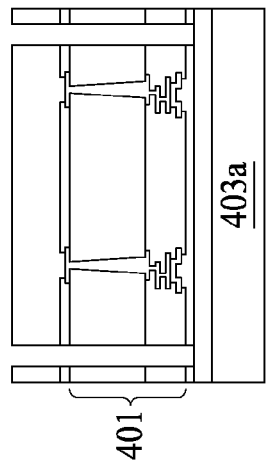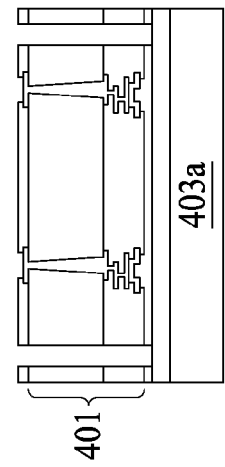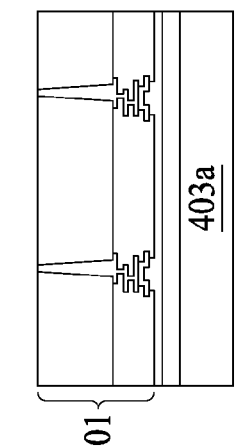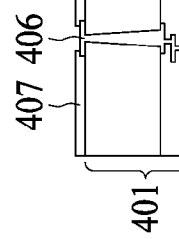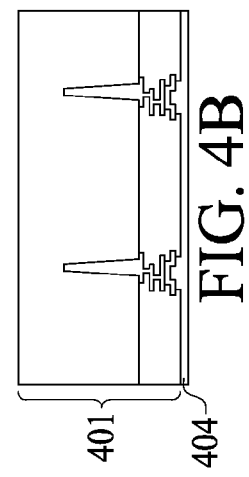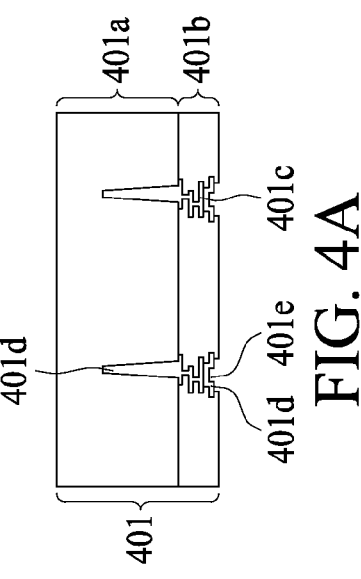

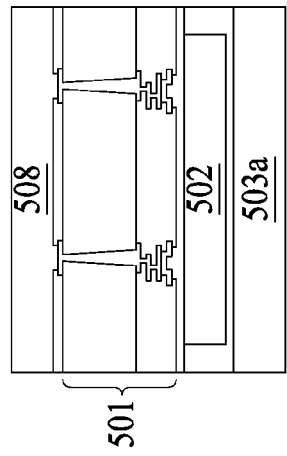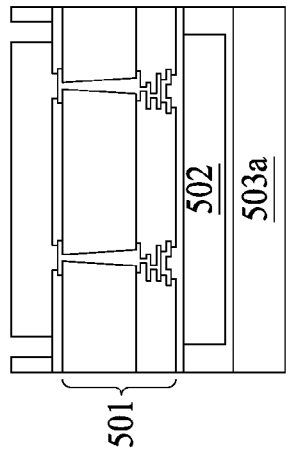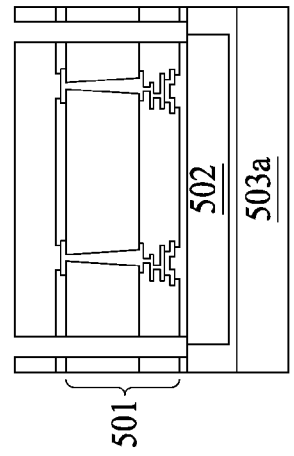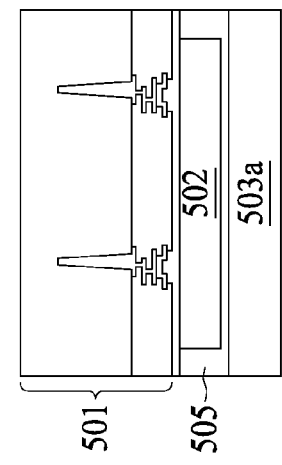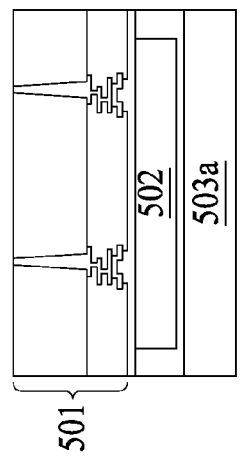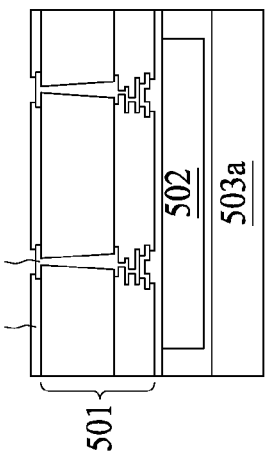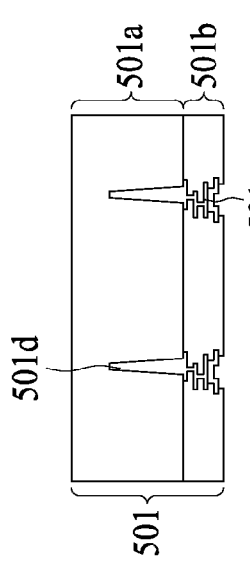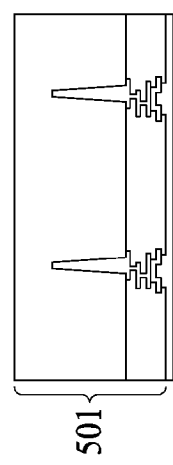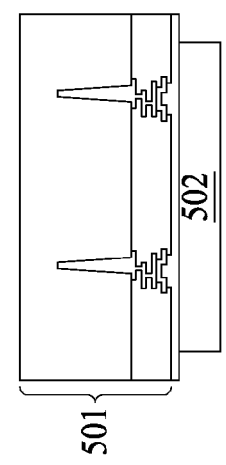

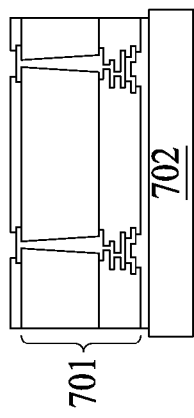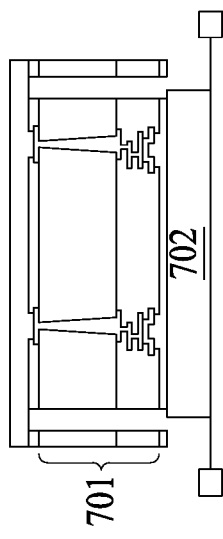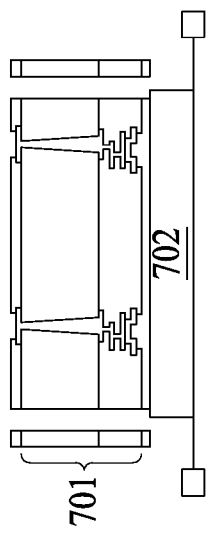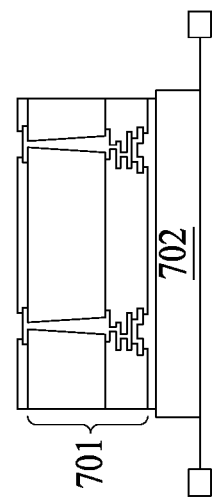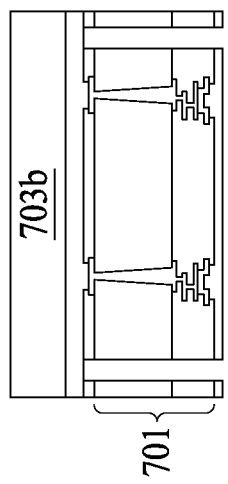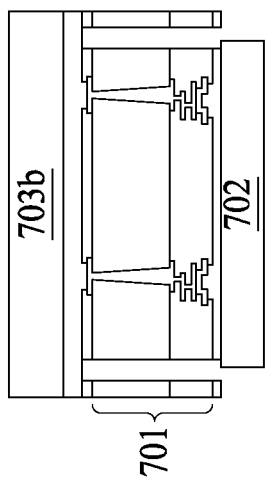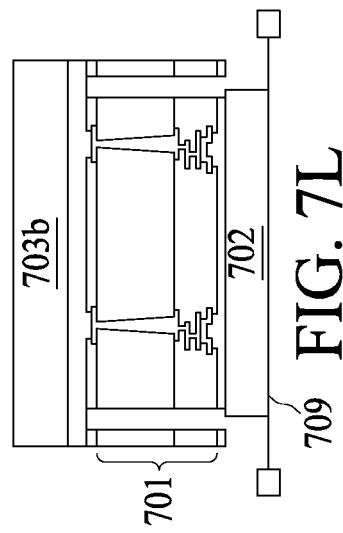

SEMICONDUCTOR STRUCTURE AND METHOD OF MANUFACTURING THE SAME

FIELD

The present disclosure relates generally to a semiconductor structure and more particularly relates to a semiconductor structure with direct bonding between wafer and glass.

BACKGROUND

Since the invention of integrated circuits, the semiconductor industry has experienced continuous rapid growth due to constant improvements in the integration density of various electronic components and semiconductor packages. For the most part, these improvements in integration density have come from repeated reductions in minimum feature size, allowing more components to be integrated into a semiconductor chip or package.

One approach for allowing more components to be integrated into a semiconductor structure is the adoption of three dimensional integrated circuit (3D IC) stacking techniques, in which silicon wafers and/or dies are stacked on one another. A common technique for stacking a semiconductor wafer and a substrate (e.g., glass or sapphire) employs the use of adhesive materials. However, one drawback of such technique is that the additional adhesive material increases the total thickness of the semiconductor stack and also deteriorates the quality of signal transmission within the semiconductor stack. Therefore, what is needed is a semiconductor stack without adhesive material for bonding different layers of wafers or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
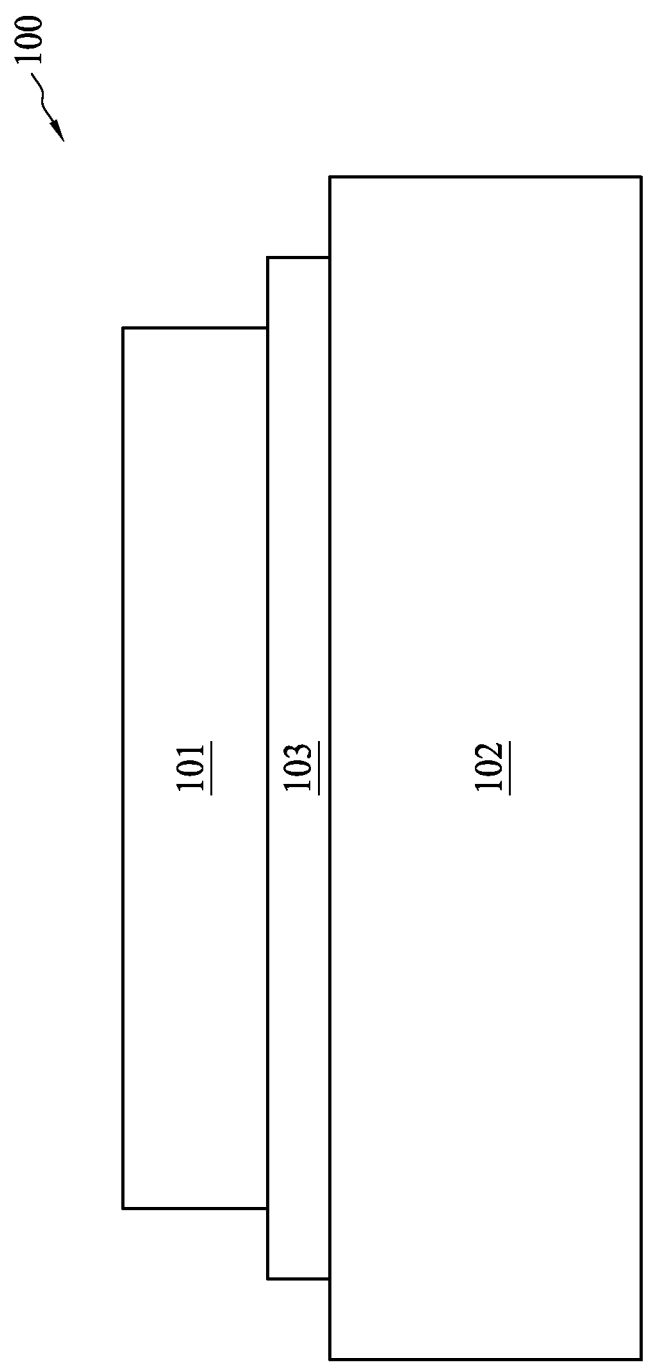
FIG. 1 is a schematic diagram illustrating a conventional chip-on-sapphire semiconductor structure.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing steps (operations) and/or features of a device may be only briefly described. Also, additional processing steps and/or features can be added, and certain of the following processing steps and/or features can be removed or changed while still implementing the claims. Thus, the following description should be understood to represent examples only, and are not intended to suggest that one or more steps or features is required.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In reference to the drawings, FIG. 1 is a schematic diagram illustrating a conventional chip-on-sapphire semiconductor structure 100 in which a semiconductor die 101 and a substrate 102 (e.g., glass or sapphire) are bonded together by adhesive material 103. The adhesive material 103 includes: epoxy, BCB (benzocyclobutene), any photoresist, any polyimide, any low temperature adhesives or any thermoset materials. The adhesive material 103 may be applied on the semiconductor die 101 and/or the substrate 102 by spinning (i.e. rotating substrate 102 while applying the adhesive material 103) or by capillary flow. The thickness of the adhesive material 103 depends on the viscosity, rotational speed and the applied tool pressure. One drawback of the semiconductor structure 100 is that the additional adhesive material 103 is needed for bonding the semiconductor die 101 and the substrate 102, which may increase the total thickness of the semiconductor die 101 and may deteriorate the quality of signal transmission within the semiconductor structure 100.

Figure 2:
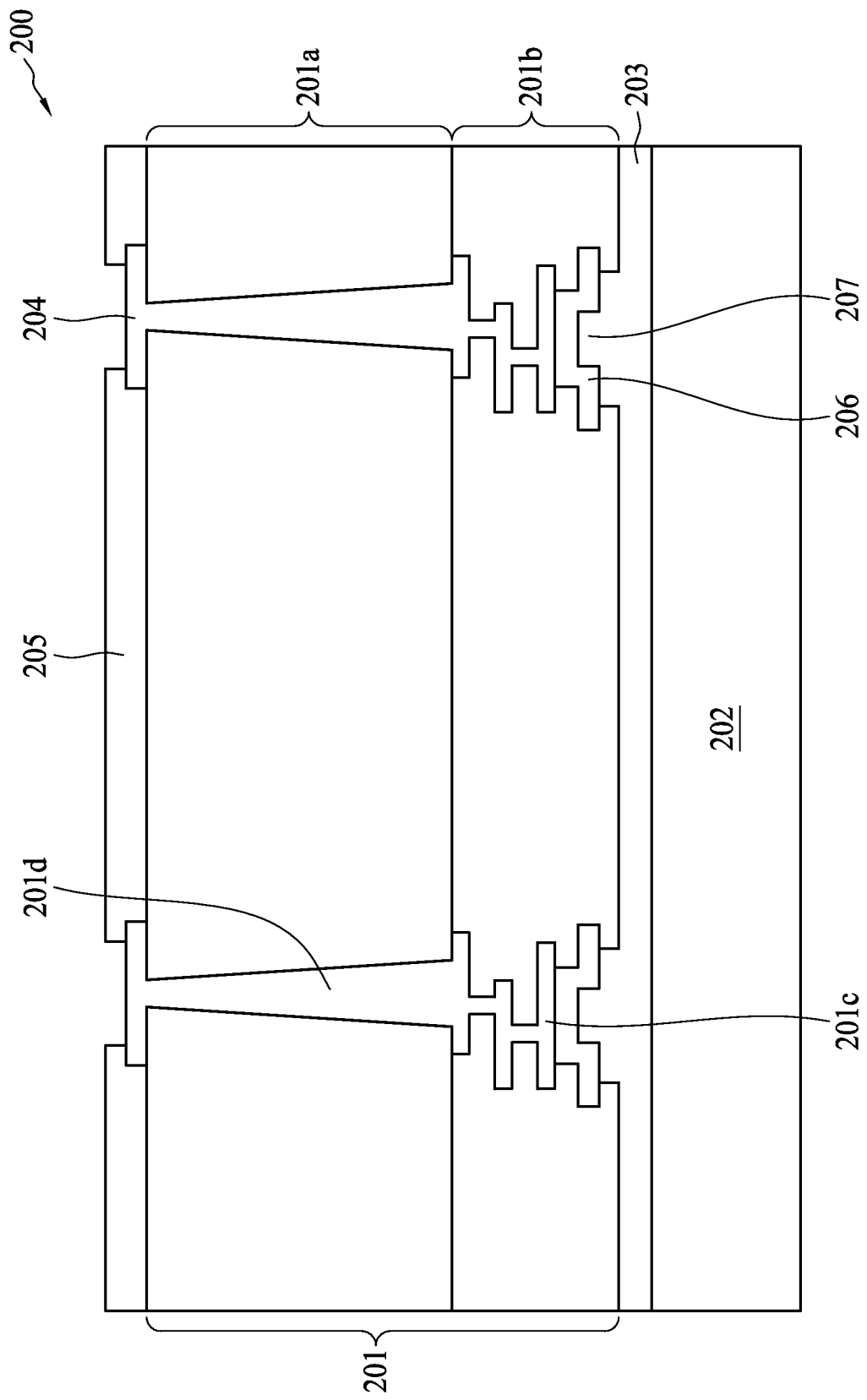
FIG. 2 is a schematic diagram illustrating a semiconductor structure in accordance with one embodiment of the present disclosure.

FIG. 2 is a schematic diagram illustrating a semiconductor structure 200 in accordance with one embodiment of the present disclosure. The semiconductor structure 200 includes a semiconductor workpiece 201, a substrate 202 and a bonding material 203, for example, oxides. The semiconductor workpiece 201 includes a substrate layer 201a and an active layer 201b. In one embodiment, the semiconductor workpiece 201 has a rectangular shape, a circular shape, or other polygonal shape. In one embodiment, the substrate 202 has a rectangular shape, a circular shape, or other polygonal shape.

The substrate layer 201a of the semiconductor workpiece 201 may include multi-layered substrates, gradient substrates, hybrid orientation substrates, any combinations thereof and/or the like. The materials for the substrate layer 201a include bulk silicon, a semiconductor wafer, a silicon-on-insulator (SOI) substrate, or a silicon germanium substrate. Other semiconductor materials including group III, group IV, and group V elements may also be used.

The active layer 201b of the semiconductor workpiece 201 may be formed of the same material (or formed in the same processing operation) as the substrate layer 201a. Alternatively, the active layer 201b may include passivation materials (e.g., oxide or dielectric). The active layer 201b may include a plurality of isolation features (not shown), such as shallow trench isolation (STI) features or local oxidation of silicon (LOCOS) features. The isolation features may define and isolate various microelectronic elements 201c. The microelectronic elements 201c may include transistors (e.g., MOSFET), complementary metal oxide semiconductor (CMOS) transistors, bipolar junction transistors (BJT), high voltage transistors, high frequency transistors, p-channel and/or n-channel field effect transistors (PFETs/NFETs), diodes, resistors, capacitors, inductors, or other suitable elements. Fabrication operations for these microelectronic elements 201c include deposition, etching, implantation, photolithography, annealing, or other suitable operations. These microelectronic elements 201c are interconnected to form logic devices, memory devices (e.g., static random access memory or SRAM), radio frequency (RF) devices, input/output (I/O) devices, system-on-chip (SoC) devices, eFlash device, microelectromechanical (MEMS) devices, analog devices, CMOS devises, combinations of these, or the like. In one embodiment, the microelectronic elements 201c include metal pads for receiving and supplying electric signals to and from other metal interconnects (not shown). In one embodiment, the semiconductor workpiece 201 may include a plurality of semiconductor dies. In one embodiment, the semiconductor workpiece 201 includes an optical sensor, a fingerprint sensor or an LED.

The substrate layer 201a of the semiconductor workpiece 201 may include electrically conductive vias 201d. The electrically conductive vias 201d serve to electrically connect the active layer 201b of the semiconductor workpiece 201 to external electrical contacts (not shown). The electrically conductive vias may be formed of tungsten, tungsten-based alloy, copper, or copper-based alloy, aluminum, gold, silver, molybdenum (Mo), titanium nitride (TiN), and the like, formed through LPCVD, PECVD, MOCVD, ALD or other advance deposition technology (e.g., a copper-fill process includes metal seed layer deposition and copper electrochemical plating).

In some embodiments, a barrier layer (oxide liner, not shown) is optionally deposited before the formation of the electrically conductive vias 201d and is arranged to encompass the electrically conductive vias 201d. The barrier layer functions as a diffusion barrier to prevent metal diffusion and as an adhesion layer between metal and dielectric. Refractory metals, refractory metal-nitrides, refractory metal-silicon-nitrides and combinations thereof are typically used for the barrier layer. In one embodiment, the electrically conductive vias 201d are through silicon vias ("TSV").

The semiconductor structure 200 may also include metal pads 204 formed to cover and electrically connect the electrically conductive vias 201d. The metal pads 204 are utilized to electrically coupling external electrical contacts to one of the I/Os of the microelectronic elements 201c. The metal pads 204 may include aluminum, copper or alloys thereof.

The semiconductor structure 200 may also include a passivation layer 205 formed over the semiconductor workpiece 201 and on top of the metal pads 204 for structural support and physical isolation. The passivation layer 205 can protect the semiconductor workpiece 201 from mechanical damage (particle/scratch/contamination) and other chemical corrosion. The passivation layer 205 may be made with silicon nitride (SiN), silicon dioxide ($SiO_2$), silicon oxynitride (SiON), polyimide (PI), benzocyclobutene (BCB), polybenzoxazole (PBO), or other insulating material.

In one embodiment, the substrate 202 is transmissive to light within a predetermined wavelength (e.g., from about 300 nanometer to about 700). The substrate 202 may include glass, ceramic and sapphire ($Al_2O_3$). As shown in FIG. 2, the substrate 202 is bonded to the semiconductor workpiece 201. In one embodiment, the bonding between the substrate 202 and the semiconductor workpiece 201 is performed by fusion bonding. The bonding operation of fusion bonding is described as follows. First, to avoid the occurrence of unbonded areas (i.e. interface bubbles), the to-be-bonded surfaces of the semiconductor workpiece 201 and the substrate 202 are processed to be sufficiently clean and smooth. In one embodiment, the to-be-bonded surfaces of the semiconductor workpiece 201 and the substrate 202 are processed (e.g., by polishing) to be very smooth, with surface roughness less than 10 Angstroms or even less than 5 Angstroms. Then, the semiconductor workpiece 201 and the substrate 202 are aligned and placed in physical contact at room temperature with slight pressure to initiate a bonding operation. Finally, an anneal at elevated temperatures is used to strengthen the chemical bonds between the to-be-bonded surfaces of the semiconductor workpiece 201 and the substrate 202 (which may be very weak bonds initially) and to transform the chemical bonds into covalent bonds. In one embodiment, the annealing temperature is less than around 400 degree Celsius.

In one embodiment, the bonding between the substrate 202 and the semiconductor workpiece 201 is performed by hybrid bonding. In hybrid bonding, dielectric material is bonded in a manner similar to fusion bonding, and metal materials are bonded using an anneal operation. Specifically, in hybrid bonding, the metal portions/pads of two wafers are bonded to each other through direct metal-to-metal bonding whereas non-metal, e.g., oxide or silicon, portions of the two wafers are bonded to each other.

In one embodiment, a bonding material 203 is arranged between the substrate 202 and the semiconductor workpiece 201 so as to facilitate the bonding therebetween. The bonding material 203 may be made from $SiO_2$, SiON or SiC. In one embodiment, the bonding material 203 fills an opening 207 formed on the surface of the active layer 201b of the semiconductor workpiece 201 and covers/contacts a metallization 206 positioned within the opening 207 and electrically connected to the microelectronic elements 201c. In one embodiment, the metallization 206 may be an Under Bump Metallization (UBM), a conductive pad, or a post-passivation interconnect (PPI).

Figure 3:
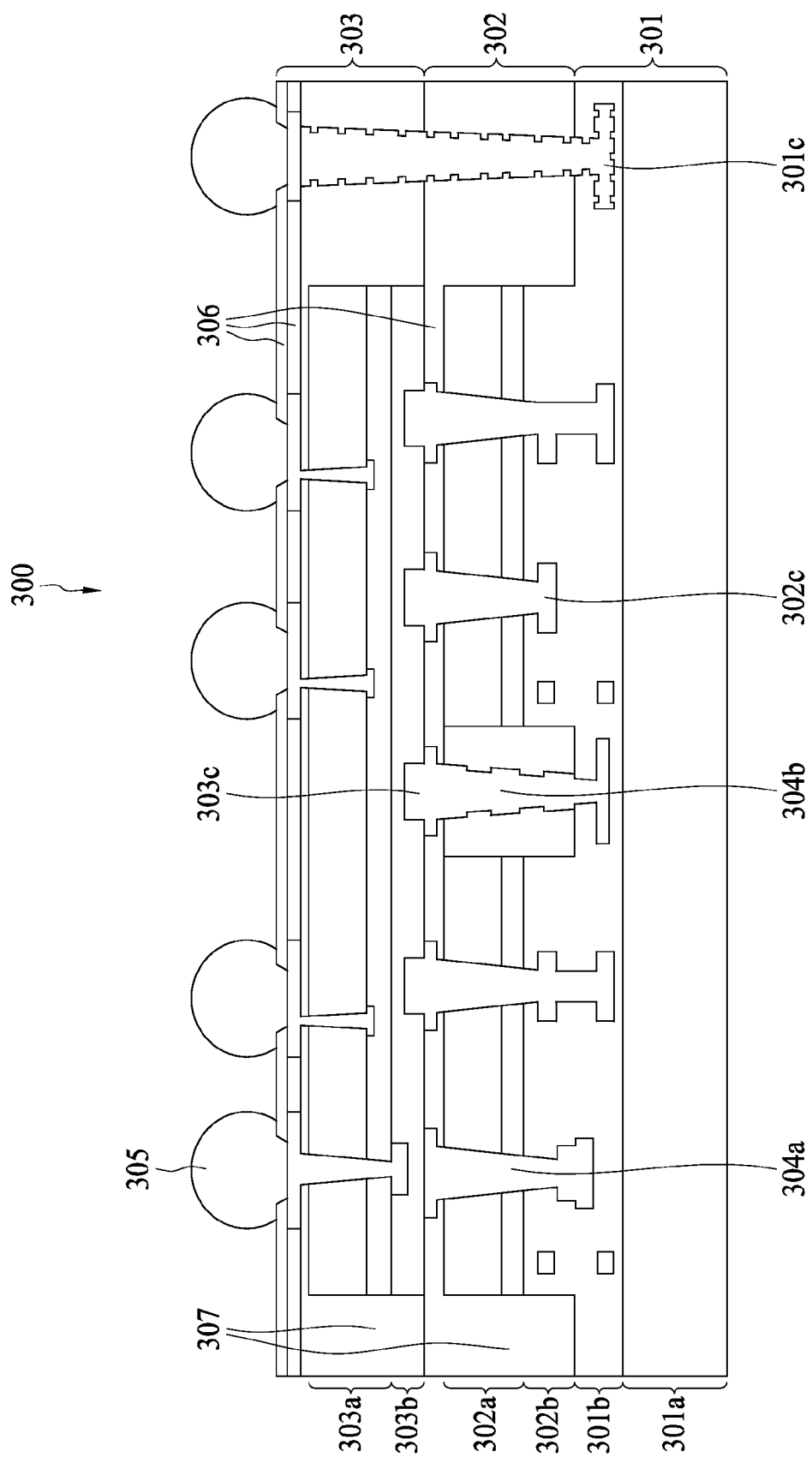
FIG. 3 is a schematic diagram illustrating a semiconductor structure in accordance with one embodiment of the present disclosure.

FIG. 3 is a schematic diagram illustrating a semiconductor structure 300 in accordance with one embodiment of the present disclosure. The semiconductor structure 300 includes a substrate 301, a first semiconductor workpiece 302 and a second semiconductor workpiece 303.

The substrate 301 includes a substrate layer 301a and an active layer 301b. The first semiconductor workpiece 302 includes a substrate layer 302a and an active layer 302b. The second semiconductor workpiece 303 includes a substrate layer 303a and an active layer 303b. The active layers 301b, 302b and 303b respectively include microelectronic elements 301c, 302c and 303c. The semiconductor structure 300 includes TSVs 304a for electrically connecting the microelectronic elements 301c, 302c and 303c and TDVs (through dielectric vias) 304b electrically connecting the elements 301c, 302c and 303c and surrounded by dielectric materials 307. Passivation layers 306 are formed over the first semiconductor workpiece 302 and the second semiconductor workpiece 303. Conductive bumps 305 are formed on the passivation layers 306.

In one embodiment, the first semiconductor workpiece 302 may include a plurality of semiconductor dies and the gaps between adjacent semiconductor dies of the first semiconductor workpiece 302 are filled with dielectric materials 307. In one embodiment, the first semiconductor workpiece 302 includes an optical sensor, a fingerprint sensor or an LED. In one embodiment, the second semiconductor workpiece 303 is a known good wafer ("KGW") having known functional circuit units with the microelectronic elements 303c positioned in a grid fashion. In one embodiment, the substrate 301 may include glass, ceramic and sapphire (Al$_2$O$_3$). Additional semiconductor workpieces may be provided and stacked on both sides of the semiconductor structure 300.

The substrate 301 may be bonded to the first semiconductor workpiece 302 by fusion bonding or hybrid bonding. The first semiconductor workpiece 302 may be bonded to the second semiconductor workpiece 303 by fusion bonding or hybrid bonding. In one embodiment, the substrate 301 is bonded to the first semiconductor workpiece 302 by hybrid bonding and the first semiconductor workpiece 302 is bonded to the second semiconductor workpiece 303 by hybrid bonding.

As shown in FIG. 3, the active layer 302b of the first semiconductor workpiece 302 and the active layer 303b of the second semiconductor workpiece 303 are arranged in a "back-to-front" bonding arrangement (i.e., semiconductor workpieces with their active layers separated by a substrate layer instead of being bonded together). This embodiment is for illustrative purpose only and thus not limiting. Any arrangement of "face-to-face," "back-to-back," or "back-to-face" combinations may be used in the bonding interface of the present disclosure.

Figure 4P:
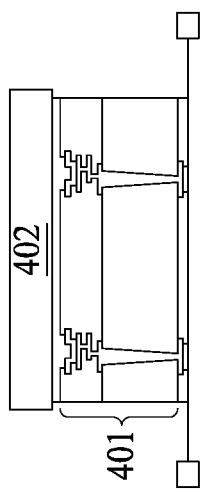
FIGS. 4A-4Q schematically illustrate a method of manufacturing a semiconductor structure in accordance with one embodiment of the present disclosure.
Figure 4Q:
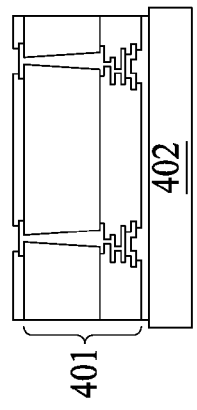

FIGS. 4A-4Q schematically illustrate operations for manufacturing a semiconductor structure in accordance with a first embodiment of the present disclosure.

In FIG. 4A, a first semiconductor workpiece 401 is provided. The first semiconductor workpiece 401 may include a substrate layer 401a and an active layer 401b. The first active layer 401b may be formed of the same material as the substrate layer 401a. Alternatively, the first active layer 401b may include passivation materials (e.g., oxide or dielectric). The first active layer 401b may include a plurality of microelectronic elements 401c. The substrate layer 401a may include electrically conductive vias 401d connecting to the microelectronic elements 401c.

In FIG. 4B, an oxide layer 404 is formed on the first active layer 401b of the first semiconductor workpiece 401. In one embodiment, the oxide layer 404 is deposited on the first semiconductor workpiece 401 at about 20 degree Celsius to about 400 degree Celsius. The oxide layer 404 may be made from SiO$_2$, SiON or SiC and may be about 0.1 micron to about 2 micron thick. The oxide layer 404 is processed to be very smooth, with surface roughness less than 10 Angstroms or even less than 5 Angstroms. The oxide layer 404 may then be surface treated to render it suitable for subsequent bonding. In one embodiment, forming the oxide layer 404 on the first semiconductor workpiece 401 further comprises filling an opening 401e on a surface of the first active layer 401b and covering a metallization 401d positioned within the opening and electrically connected to the microelectronic elements 401c (see FIG. 4A and FIG. 4B).

In FIG. 4C, a first carrier substrate (carrier) 403a is bonded to the oxide layer 404 using glue material 405. The carrier substrate 403a serves to provide mechanical support for the semiconductor workpiece 401 so as to facilitate further processing.

In FIG. 4D, a backsided of the semiconductor workpiece 401 is thinned down to reduce the total thickness and to reveal the electrically conductive vias 401d. Specifically, the thinning is performed by thinning down the substrate layer 401a of the semiconductor workpiece 401. The thinning can be done by mechanical grinding, chemical mechanical polishing (CMP), wet etching, atmospheric downstream plasma (ADP) dry chemical etching (DCE), a combination of aforementioned operations or any another appropriate thinning method(s). In one embodiment, the semiconductor workpiece 401 is thinned down to be less than about 50 micron thick. In one embodiment, the semiconductor workpiece 401 is thinned down to be less than about 10 micron thick.

In FIG. 4E, metal pads 406 are formed to cover and electrically connect to the electrically conductive vias 401d. The metal pads 406 are utilized to electrically coupling external electrical contacts to one of the I/Os of the microelectronic elements 401c. The metal pads 406 may include aluminum, copper or alloys thereof. After the formation of the metal pads 406, a passivation layer 407 is formed over the semiconductor workpiece 401 and on top of the metal pads 406 for structural support and physical isolation. The passivation layer 407 can protect the semiconductor workpiece 401 from mechanical damage (particle/scratch/contamination) and other chemical corrosion. The passivation layer 407 is then patterned to include openings so as to expose the metal pads 406. In some embodiments, the metal pads 406 can be a redistribution layer (RDL) over the backside of the semiconductor workpiece 401.

In FIG. 4F, a photoresist layer 408 formed on the passivation layer 407 and is then patterned by exposure, bake, developing, and/or other photolithography operations and exposing part of the underlying passivation layer 407 (FIG. 4G).

In FIG. 4H, the exposed passivation layer 407 and the underlying semiconductor workpiece 401 is then diced/etched, by a wet etch or dry etch process, using the patterned photoresist layer 408 as a masking element.

In FIG. 4I, the photoresist layer 408 is removed. The removal of the photoresist layer 408 may be achieved by exposing the photoresist layer 408 to heated solvent vapors. In one embodiment, the vapor solvent includes isopropyl alcohol. Subsequent to the photoresist material removal, the semiconductor workpiece 401 is preferably subjected to cleaning, rinsing, and drying methods.

Figure 4M:
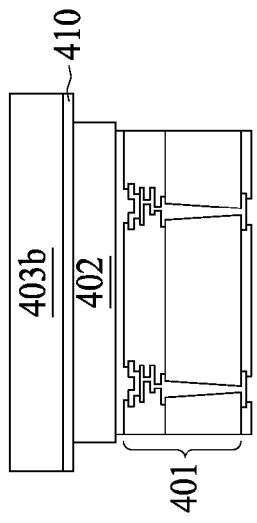
Figure 4N:
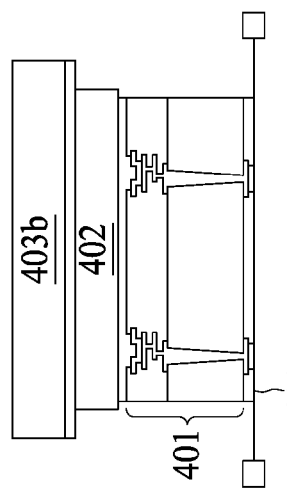
Figure 4O:
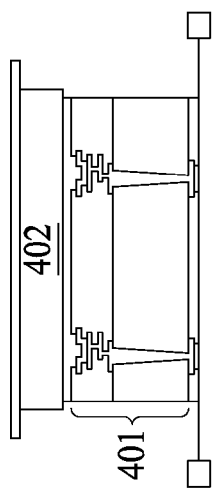
Figure 4J:
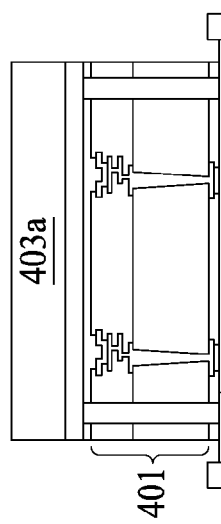

In FIG. 4J, the semiconductor workpiece 401 is mounted on a mounting frame (tape) 409 to facilitate subsequent transportation.

Figure 4K:
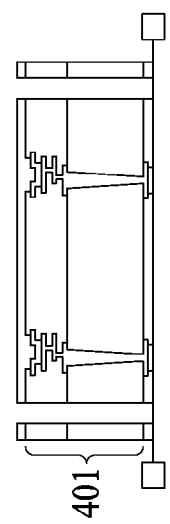

In FIG. 4K, the carrier substrate 403a and the glue material 405 are both removed from the semiconductor workpiece 401.

Figure 4L:
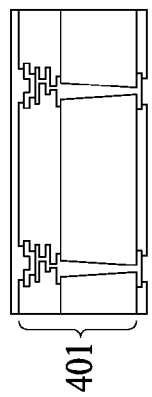

In FIG. 4L, the semiconductor workpiece 401 is reconstructed and the mounting frame 409 is removed (i.e., one diced semiconductor workpiece 401, hereinafter referred to a chip or a die, is obtained after removing multiple diced semiconductor workpieces from the frame (tape)).

In FIG. 4M, a substrate 402 provided on a carrier substrate 403a (with a glue material 410 arranged therebetween) is bonded to the oxide layer 404 on the semiconductor workpiece 401. The substrate 402 may be transmissive to light within a predetermined wavelength (e.g., from about 300 nanometer to about 700). The substrate 402 may include glass, ceramic and sapphire ($Al_2O_3$). In one embodiment, the bonding between the substrate 402 and the semiconductor workpiece 401 (the oxide layer 404) may be performed by fusion bonding or hybrid bonding.

As previously stated, prior to the bonding process, the oxide layer 404 may be surface treated to render it suitable for subsequent bonding.

Suitable surface treatments include wet chemical treatments involving ammonium hydroxide, nitric acid, sulfuric acid, hydrogen peroxide, or periodic acid ($H_5IO_6$) which terminate the surfaces with hydroxyl groups, thereby promoting bonding between mating surfaces by the initial formation of hydrogen bonds and the subsequent formation of stronger siloxane bonds.

More specifically, the oxide layer 404 is surface treated to be terminated by —OH groups and then, as the surfaces are brought into contact, the hydrogen from one OH terminated surface bonds with the oxygen from the other OH terminated surface.

More specifically, prior to bonding, the surface of the oxide layer 404 and the surface of the substrate 402 may be exposed to a $NH_4OH$ solution. This treatment may be performed by immersing the semiconductor workpiece 401 and the substrate 402 into a $NH_4OH$ solution, dip coating, spray coating, or by brushing. The wet chemical treatment involving $NH_4OH$ results in strong bonding across the bonding interface.

Alternatively, suitable surface treatments include the application of oxygen, ammonia, or water plasma. Immersing the bonding surfaces in a plasma may help clean the surface of organic contaminants, while facilitating the termination of the surfaces with the —OH groups resulting in strong direct bonding.

An optional oxide layer (not shown) may be formed on the substrate 402 and the bonding between the substrate 402 and the semiconductor workpiece 401 is thus performed by bonding the two oxide layers.

In one embodiment, the bonding between the substrate 402 and the semiconductor workpiece 401 (the oxide layer 404) may be performed at temperature ranges from about 20 degree Celsius to about 300 degree Celsius. In one embodiment, the bonding between the substrate 402 and the semiconductor workpiece 401 (the oxide layer 404) may be performed under pressure ranging from about 1 $kg/cm^2$ to about 5 $kg/cm^2$.

In FIG. 4N, the semiconductor workpiece 401 (bonded to the substrate 402) is mounted on a mounting frame 411 to facilitate subsequent transportation.

In FIG. 4O, the carrier substrate 403a is removed from the substrate 402. In FIG. 4P, the glue material 410 is removed from the substrate 402. In FIG. 4Q, the mounting frame 411 is removed and shows a semiconductor structure manufactured in accordance with the first method embodiment of the present disclosure.

Figure 5J:
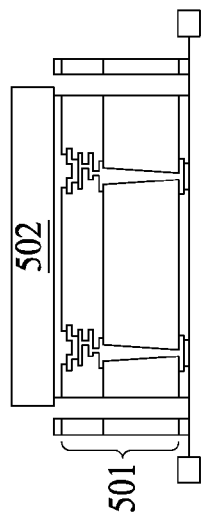
FIGS. 5A-5O schematically illustrate a method of manufacturing a semiconductor structure in accordance with one embodiment of the present disclosure.
Figure 5K:
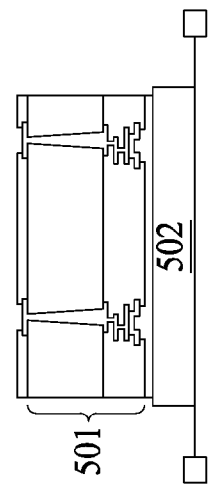
Figure 5L:
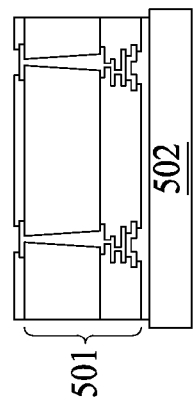
Figure 5M:
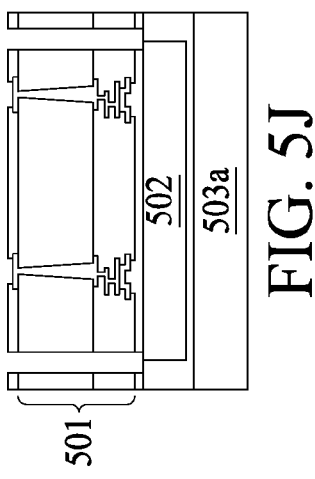
Figure 5N:
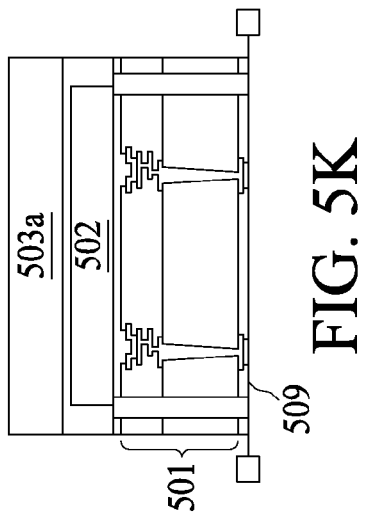
Figure 5O:
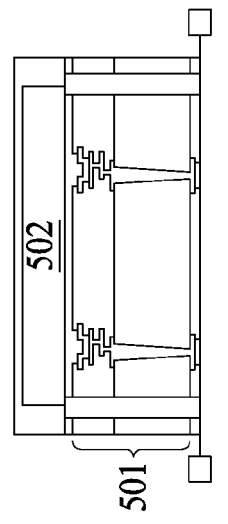

FIGS. 5A-5O schematically illustrate operations for manufacturing a semiconductor structure in accordance with a second embodiment of the present disclosure.

In FIG. 5A, a first semiconductor workpiece 501 is provided. The first semiconductor workpiece 501 may include a substrate layer 501a and an active layer 501b. The first active layer 501b may include a plurality of microelectronic elements 501c. The substrate layer 501a may include electrically conductive vias 501d connecting to the microelectronic elements 501c.

In FIG. 5B, an oxide layer 504 is formed on the first active layer 501b of the first semiconductor workpiece 501. In one embodiment, the oxide layer 504 is deposited on the first semiconductor workpiece 501 at about 20 degree Celsius to about 500 degree Celsius. The oxide layer 504 may be made from $SiO_2$, SiON or SiC and may be about 0.1 micron to about 2 micron thick. The oxide layer 504 is processed to be very smooth, with surface roughness less than 10 Angstroms or even less than 5 Angstroms. The oxide layer 504 may then be surface treated to render it suitable for subsequent bonding.

In FIG. 5C, a substrate 502 is bonded to the oxide layer 504 on the semiconductor workpiece 501. The substrate 502 may be transmissive to light within a predetermined wavelength (e.g., from about 300 nanometer to about 700). The substrate 502 may include glass, ceramic and sapphire ($Al_2O_3$). In one embodiment, the bonding between the substrate 502 and the semiconductor workpiece 501 (the oxide layer 504) may be performed by fusion bonding or hybrid bonding. Note the substrate 502 can be pre-diced close to an area of a semiconductor chip/die to be fabricated. Multiple diced substrates 502 are positioned over a semiconductor workpiece 501 when the semiconductor workpiece 501 is in a form of a semiconductor wafer.

In one embodiment, the bonding between the substrate 502 and the semiconductor workpiece 501 (the oxide layer 504) may be performed at temperature ranges from about 20 degree Celsius to about 300 degree Celsius. In one embodiment, the bonding between the substrate 502 and the semiconductor workpiece 501 (the oxide layer 504) may be performed under pressure ranging from about 1 $kg/cm^2$ to about 5 $kg/cm^2$. In one embodiment, the oxide layer 504 may be surface treated to render it suitable for subsequent bonding.

In FIG. 5D, a first carrier substrate (carrier) 503a is bonded to the substrate 502 using glue material 505. The carrier substrate 503a serves to provide mechanical support for the semiconductor workpiece 501 so as to facilitate further processing.

In FIG. 5E, a backside of the semiconductor workpiece 501 is thinned down to reduce the total thickness and to reveal the electrically conductive vias 501d. In one embodiment, the semiconductor workpiece 501 is thinned down to be less than about 50 micron thick. In one embodiment, the semiconductor workpiece 501 is thinned down to be less than about 10 micron thick.

In FIG. 5F, metal pads 506 are formed to cover and electrically connect to the electrically conductive vias 501d. The metal pads 506 are utilized to electrically coupling external electrical contacts to one of the I/Os of the microelectronic elements 501c. The metal pads 506 may include aluminum, copper or alloys thereof. After the formation of the metal pads 506, a passivation layer 507 is formed over the semiconductor workpiece 501 and on top of the metal pads 506 for structural support and physical isolation. The passivation layer 507 can protect the semiconductor workpiece 501 from mechanical damage (particle/scratch/contamination) and other chemical corrosion. The passivation layer 507 is then patterned to include openings so as to expose the metal pads 506. In some embodiments, the metal pads 506 can be a redistribution layer (RDL) over the backside of the semiconductor workpiece 501.

In FIG. 5G, a photoresist layer 508 formed on the passivation layer 507 and is then patterned by exposure, bake, developing, and/or other photolithography operations and exposing part of the underlying passivation layer 507 (FIG. 5H).

In FIG. 5I, the exposed passivation layer 507 and the underlying semiconductor workpiece 501 is then diced/etched, by a wet etch or dry etch process, using the patterned photoresist layer 508 as a masking element.

In FIG. 5J, the photoresist layer 508 is removed. The removal of the photoresist layer 508 may be achieved by exposing the photoresist layer 508 to heated solvent vapors. In one embodiment, the vapor solvent includes isopropyl alcohol. Subsequent to the photoresist material removal, the semiconductor workpiece 501 is preferably subjected to cleaning, rinsing, and drying methods.

In FIG. 5K, the semiconductor workpiece 501 is mounted on a mounting frame (tape) 509 to facilitate subsequent transportation.

In FIGS. 5L and 5M, the carrier substrate 503a and the glue material 505 are both removed from the semiconductor workpiece 501.

In FIG. 5N, the semiconductor workpiece 501 is re-constructed. In one embodiment, the re-construction of the semiconductor workpiece 501 is to obtain one diced semiconductor workpiece 501, hereinafter referred to a chip or a die, after removing multiple diced semiconductor workpieces from the frame (tape).

In FIG. 5O, the mounting frame 509 is removed and shows a semiconductor structure manufactured in accordance with the second method embodiment of the present disclosure.

The operations illustrated in FIG. 5A to FIG. 5O uses less carrier substrate compared to the operations illustrated in FIG. 4A to FIG. 4Q. In addition, the substrate 402 is bonded to the re-constructed semiconductor workpiece 401 after the wafer being diced into multiple chips/dies, whereas the substrate 502 is bonded to the semiconductor workpiece 501 before the wafer being diced into multiple chips/dies.

Figure 6A:
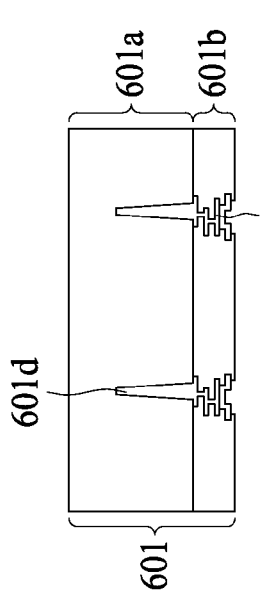
FIGS. 6A-6Q schematically illustrate a method of manufacturing a semiconductor structure in accordance with one embodiment of the present disclosure.
Figure 6B:
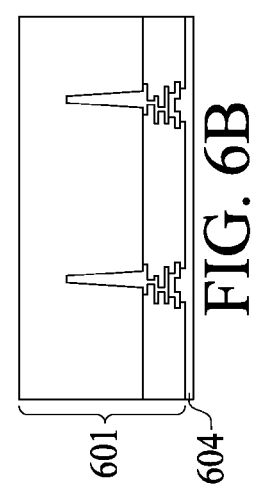
Figure 6C:
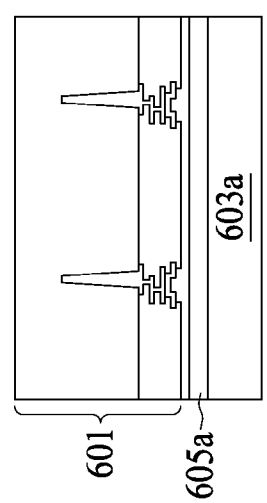
Figure 6D:
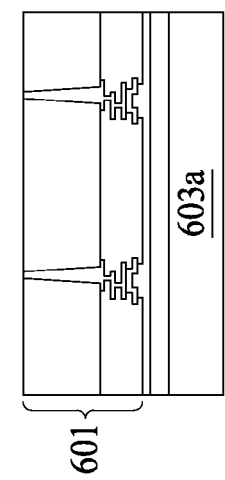
Figure 6E:
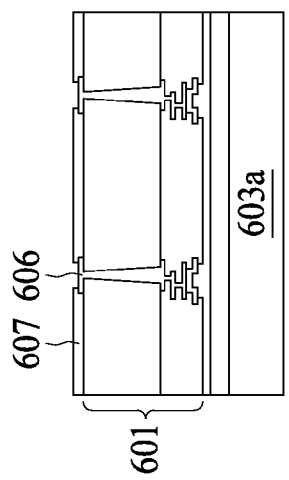
Figure 6F:
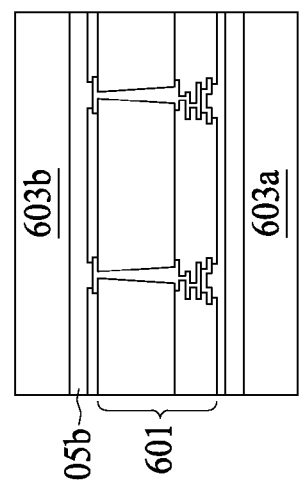
Figure 6G:
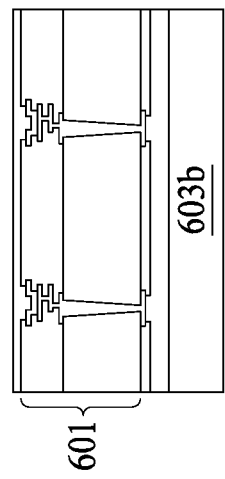
Figure 6H:
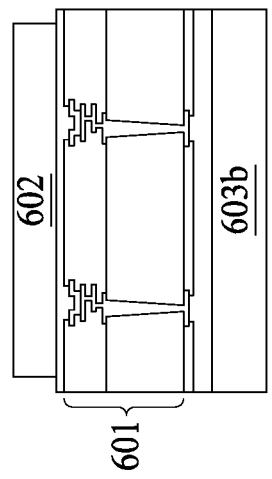
Figure 6I:
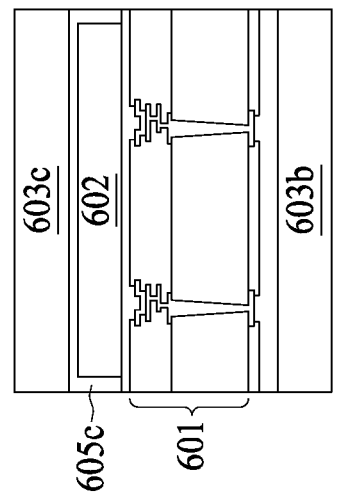
Figure 6J:
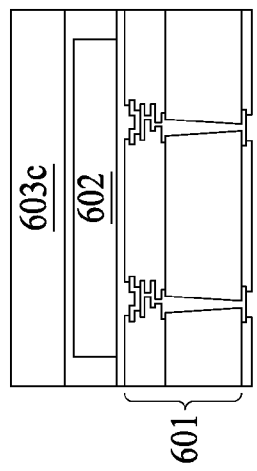
Figure 6K:
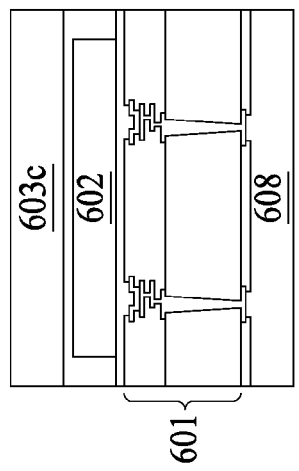
Figure 6L:
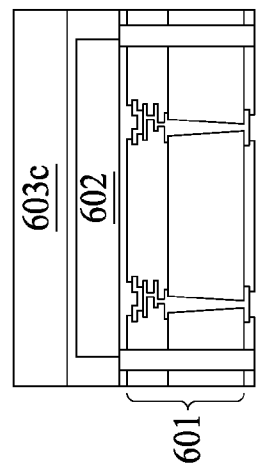
Figure 6M:
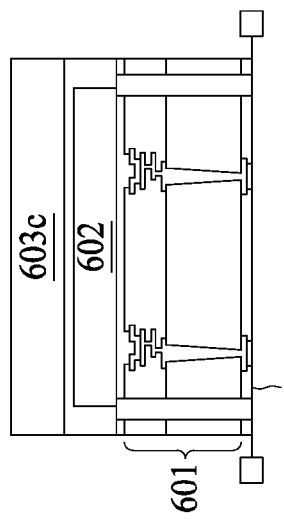
Figure 6N:
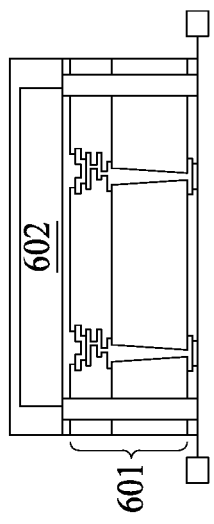
Figure 6O:
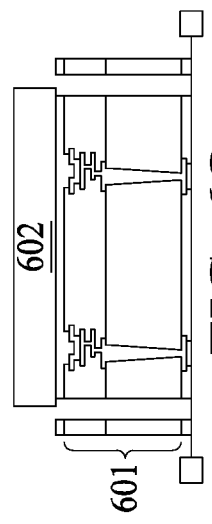
Figure 6P:
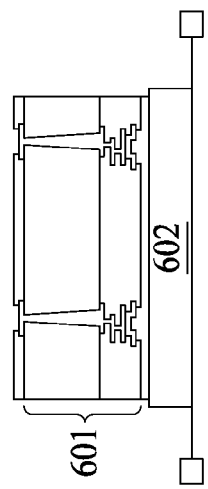
Figure 6Q:
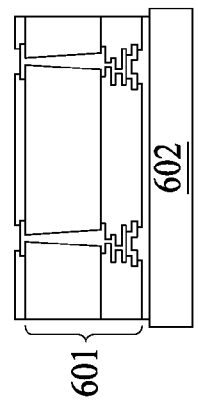

FIGS. 6A-6Q schematically illustrate operations for manufacturing a semiconductor structure in accordance with a third embodiment of the present disclosure.

In FIG. 6A, a first semiconductor workpiece 601 is provided. The first semiconductor workpiece 601 may include a substrate layer 601a and an active layer 601b. The first active layer 601b may include a plurality of microelectronic elements 601c. The substrate layer 601a may include electrically conductive vias 601d connecting to the microelectronic elements 601c.

In FIG. 6B, an oxide layer 604 is applied on the first active layer 601b of the first semiconductor workpiece 601. In one embodiment, the oxide layer 604 is deposited on the first semiconductor workpiece 601 at about 20 degree Celsius to about 500 degree Celsius. The oxide layer 604 may be made from $SiO_2$, SiON or SiC and may be about 0.1 micron to about 2 micron thick. The oxide layer 604 is processed to be very smooth, with surface roughness less than 10 Angstroms or even less than 5 Angstroms. The oxide layer 604 may then be surface treated to render it suitable for subsequent bonding.

In FIG. 6C, a first carrier substrate (carrier) 603a is bonded to the oxide layer 604 using glue material 605a. The carrier substrate 603a serves to provide mechanical support for the semiconductor workpiece 601 so as to facilitate further processing.

In FIG. 6D, a backside of the semiconductor workpiece 601 is thinned down to reduce the total thickness and to reveal the electrically conductive vias 601d. In one embodiment, the semiconductor workpiece 601 is thinned down to be less than about 50 micron thick. In one embodiment, the semiconductor workpiece 601 is thinned down to be less than about 10 micron thick.

In FIG. 6E, metal pads 606 are formed to cover and electrically connect to the electrically conductive vias 601d. The metal pads 606 are utilized to electrically coupling external electrical contacts to one of the I/Os of the microelectronic elements 601c. After the formation of the metal pads 606, a passivation layer 607 is formed over the semiconductor workpiece 601 and on top of the metal pads 606 for structural support and physical isolation. The passivation layer 607 can protect the semiconductor workpiece 601 from mechanical damage (particle/scratch/contamination) and other chemical corrosion. The passivation layer 607 is then patterned to include openings so as to expose the metal pads 606. In some embodiments, the metal pads 606 can be a redistribution layer (RDL) over the backside of the semiconductor workpiece 601.

In FIG. 6F, a second carrier substrate (carrier) 603b is bonded to the passivation layer 607 using glue material 605b.

In FIG. 6G, the carrier substrate 603a and the glue material 605a are both removed from the semiconductor workpiece 601.

In FIG. 6H, a substrate 602 is bonded to the oxide layer 604 on the semiconductor workpiece 601. The substrate 602 may be transmissive to light within a predetermined wavelength (e.g., from about 300 nanometer to about 700). The substrate 602 may include glass, ceramic and sapphire ($Al_2O_3$). In one embodiment, the bonding between the substrate 602 and the semiconductor workpiece 601 (the oxide layer 604) may be performed by fusion bonding or hybrid bonding. Note the substrate 602 can be pre-diced close to an area of a semiconductor chip/die to be fabricated. Multiple diced substrates 602 are positioned over a semiconductor workpiece 601 when the semiconductor workpiece 601 is in a form of a semiconductor wafer.

In one embodiment, the bonding between the substrate 602 and the semiconductor workpiece 601 (the oxide layer 604) may be performed at temperature ranges from about 20 degree Celsius to about 300 degree Celsius. In one embodiment, the bonding between the substrate 602 and the semiconductor workpiece 601 (the oxide layer 604) may be performed under pressure ranging from about 1 kg/cm$^2$ to about 5 kg/cm$^2$. In one embodiment, the oxide layer 604 may be surface treated to render it suitable for subsequent bonding.

In FIG. 6I, a third carrier substrate (carrier) 603c is bonded to the substrate 602 using glue material 605c.

In FIG. 6J, the second carrier substrate 603b and the glue material 605b are both removed from the semiconductor workpiece 601.

In FIG. 6K, a photoresist layer 608 formed on the passivation layer 607 and is then patterned by exposure, bake, developing, and/or other photolithography operations and exposing part of the underlying passivation layer 607.

In FIG. 6L, the exposed passivation layer 607 and the underlying semiconductor workpiece 601 is then diced/etched, by a wet etch or dry etch process, using the patterned photoresist layer 608 as a masking element.

In FIG. 6M, the semiconductor workpiece 601 is mounted on a mounting frame (tape) 609 to facilitate subsequent transportation.

In FIGS. 6N and 6O, the third carrier substrate 603c and the glue material 605c are both removed.

In FIG. 6P, the semiconductor workpiece 601 is re-constructed. In one embodiment, the re-construction is to obtain one diced semiconductor workpiece 601, hereinafter referred to a chip or a die, after removing multiple diced semiconductor workpieces from the mounting frame (tape) 609.

In FIG. 6Q, the mounting frame 609 is removed and shows a semiconductor structure manufactured in accordance with the third method embodiment of the present disclosure.

Note the operations illustrated in FIG. 6A to FIG. 6Q employ multiple substrate carriers 603a, 603b, 603c in order to protect the substrate 602 from possible damages during the operations. After the conductive routings for the frontside and the backside of the semiconductor workpiece 601 are completed and before the diced/etched operation is performed, the substrate 602 is bonded to the front side of the semiconductor workpiece 601.

Figure 7A:
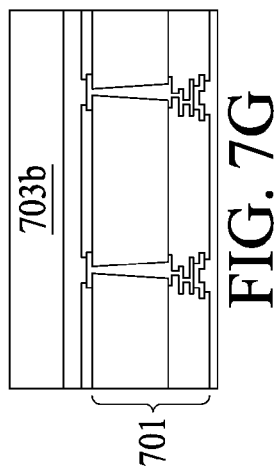
FIGS. 7A-7P schematically illustrate a method of manufacturing a semiconductor structure in accordance with one embodiment of the present disclosure.

FIGS. 7A-7P schematically illustrate operations for manufacturing a semiconductor structure in accordance with a third embodiment of the present disclosure.

In FIG. 7A, a first semiconductor workpiece 701 is provided. The first semiconductor workpiece 701 may include a substrate layer 701a and an active layer 701b. The first active layer 701b may include a plurality of microelectronic elements 701c. The substrate layer 701a may include electrically conductive vias 701d connecting to the microelectronic elements 701c.

Figure 7D:
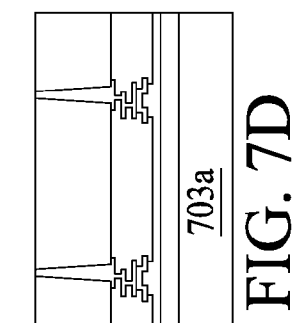
Figure 7G:
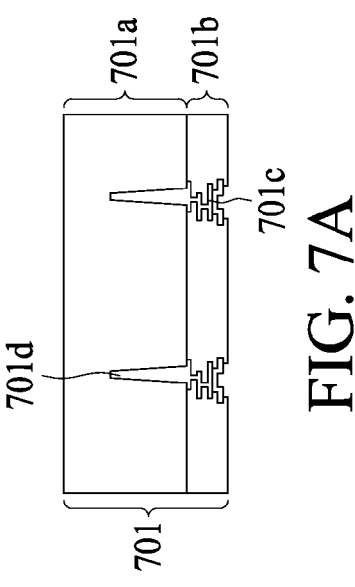
Figure 7B:
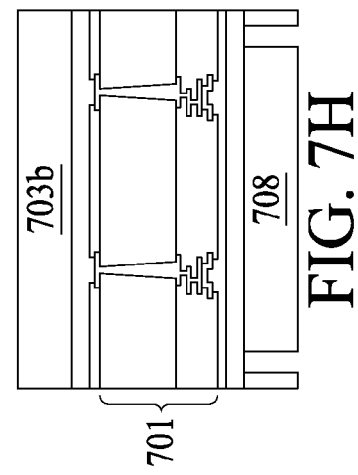

In FIG. 7B, an oxide layer 704 is applied on the first active layer 701b of the first semiconductor workpiece 701. In one embodiment, the oxide layer 704 is deposited on the first semiconductor workpiece 701 at about 20 degree Celsius to about 500 degree Celsius. The oxide layer 704 may be made from $SiO_2$, SiON or SiC and may be about 0.1 micron to about 2 micron thick. The oxide layer 704 is processed to be very smooth, with surface roughness less than 10 Angstroms or even less than 5 Angstroms. The oxide layer 704 may then be surface treated to render it suitable for subsequent bonding.

Figure 7E:
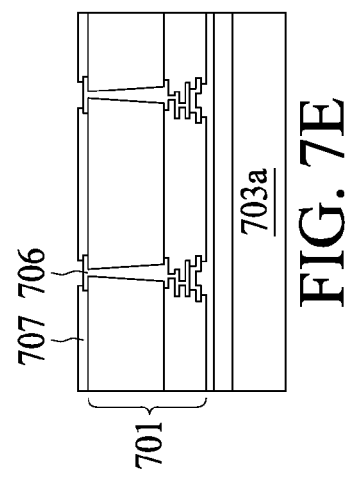
Figure 7H:
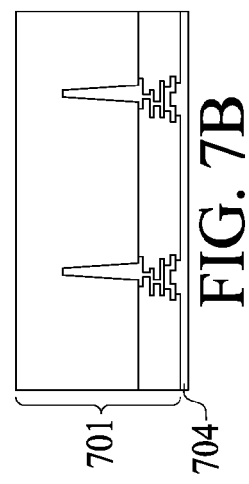
Figure 7C:
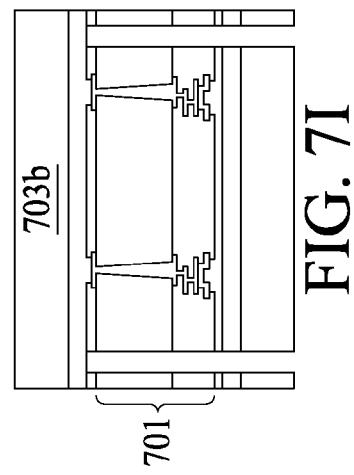

In FIG. 7C, a first carrier substrate 703a is bonded to the oxide layer 704 using glue material 705a. The carrier substrate 703a serves to provide mechanical support for the semiconductor workpiece 701 so as to facilitate further processing.

In FIG. 7D, a backside of the semiconductor workpiece 701 is thinned down to reduce the total thickness and to reveal the electrically conductive vias 701d. In one embodiment, the semiconductor workpiece 701 is thinned down to be less than about 50 micron thick. In one embodiment, the semiconductor workpiece 701 is thinned down to be less than about 10 micron thick.

In FIG. 7E, metal pads 706 are formed to cover and electrically connect to the electrically conductive vias 701d. The metal pads 706 are utilized to electrically coupling external electrical contacts to one of the I/Os of the microelectronic elements 701c. After the formation of the metal pads 706, a passivation layer 707 is formed over the semiconductor workpiece 701 and on top of the metal pads 706 for structural support and physical isolation. The passivation layer 707 can protect the semiconductor workpiece 701 from mechanical damage (particle/scratch/contamination) and other chemical corrosion. The passivation layer 707 is then patterned to include openings so as to expose the metal pads 706. In some embodiments, the metal pads 706 can be a redistribution layer (RDL) over the backside of the semiconductor workpiece 701.

Figure 7F:
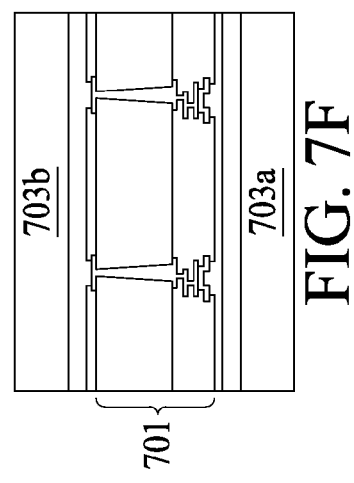

In FIG. 7F, a second carrier substrate (carrier) 703b is bonded to the passivation layer 707 using glue material 705b.

In FIG. 7G, the first carrier substrate 703a and the glue material 705a are both removed from the semiconductor workpiece 701.

In FIG. 7H, a photoresist layer 708 formed on the passivation layer 707 and is then patterned by exposure, bake, developing, and/or other photolithography operations and exposing part of the underlying passivation layer 707.

Figure 7I:
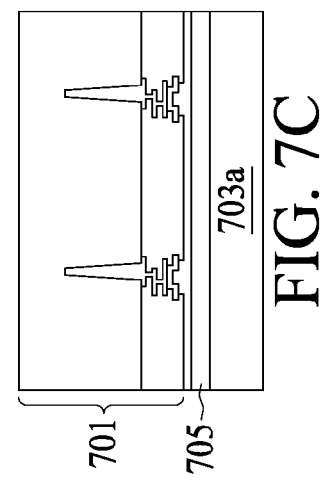

In FIG. 7I, the exposed passivation layer 707 and the underlying semiconductor workpiece 701 is then diced/etched, by a wet etch or dry etch process, using the patterned photoresist layer 708 as a masking element.

In FIG. 7J, the photoresist layer 708 is removed. The removal of the photoresist layer 708 may be achieved by exposing the photoresist layer 708 to heated solvent vapors. In one embodiment, the vapor solvent includes isopropyl alcohol. Subsequent to the photoresist material removal, the semiconductor workpiece 701 is preferably subjected to cleaning, rinsing, and drying methods.

In FIG. 7K, a substrate 702 is bonded to the oxide layer 704 on the semiconductor workpiece 701. The substrate 702 may be transmissive to light within a predetermined wavelength (e.g., from about 300 nanometer to about 700). The substrate 702 may include glass, ceramic and sapphire ($Al_2O_3$). In one embodiment, the bonding between the substrate 702 and the semiconductor workpiece 701 (the oxide layer 704) may be performed by fusion bonding or hybrid bonding. Note the substrate 702 can be pre-diced close to an area of a semiconductor chip/die to be fabricated. Multiple diced substrates 702 are positioned over a semiconductor workpiece 701 after the semiconductor workpieces 701 are separated through a diced/etched operation.

In one embodiment, the bonding between the substrate 702 and the semiconductor workpiece 701 (the oxide layer 704) may be performed at temperature ranges from about 20 degree Celsius to about 300 degree Celsius. In one embodiment, the bonding between the substrate 702 and the semiconductor workpiece 701 (the oxide layer 704) may be performed under pressure ranging from about 1 kg/cm² to about 5 kg/cm². In one embodiment, the oxide layer 704 may be surface treated to render it suitable for subsequent bonding.

In FIG. 7L, the semiconductor workpiece 701 is mounted on a mounting frame (tape) 709 to facilitate subsequent transportation.

In FIGS. 7M and 7N, the carrier substrate 703b and the glue material 705b are both removed.

In FIG. 7O, the semiconductor workpiece 701 is re-constructed. In one embodiment, the re-construction of the semiconductor workpiece 701 is to obtain one diced semiconductor workpiece 701, hereinafter referred to a chip or a die, after removing multiple diced semiconductor workpieces from the frame (tape).

In FIG. 7P, the mounting frame 709 is removed and shows a semiconductor structure manufactured in accordance with the third method embodiment of the present disclosure.

Compared to operations illustrated in FIG. 6A to FIG. 6Q and operations illustrated in FIG. 7A to FIG. 7P, the substrate 702 is disposed over the semiconductor workpiece 701 after the diced/etched operation is performed.

Some embodiments of the present disclosure provide a method for forming a semiconductor structure comprising: providing a first semiconductor workpiece; depositing a first film on a first surface of the semiconductor workpiece; depositing a second film on a substrate that is transmissive to light within a predetermined wavelength range; and bonding the first film to the second film under a predetermined bonding temperature and a predetermined bonding pressure.

Some embodiments of the present disclosure provide a method for forming a semiconductor structure comprising: providing a first semiconductor substrate; depositing an oxide layer on a first surface of the first semiconductor substrate; bonding a sapphire substrate to the oxide layer under a predetermined bonding temperature and a predetermined bonding pressure; and dicing the first semiconductor substrate to form a plurality of first semiconductor chips.

Some embodiments of the present disclosure provide a semiconductor structure, comprising: a first semiconductor chip; an oxide layer on a first surface of the first semiconductor chip; and a sapphire substrate bonded to the oxide layer.

The methods and features of this disclosure have been sufficiently described in the above examples and descriptions. It should be understood that any modifications or changes without departing from the spirit of the disclosure are intended to be covered in the protection scope of the disclosure.

Moreover, the scope of the present application is not intended to be limited to the particular embodiments of the process, machine, manufacture, and composition of matter, means, methods and steps described in the specification. As those skilled in the art will readily appreciate from the disclosure of the present disclosure, operations, machines, manufacture, composition of matter, means, methods or steps presently existing or later to be developed, that perform substantially the same function or achieve substantially the same result as the corresponding embodiments described herein may be utilized according to the present disclosure. Accordingly, the appended claims are intended to include within their scope such as operations, machines, manufacture, compositions of matter, means, methods or steps/operations. In addition, each claim constitutes a separate embodiment, and the combination of various claims and embodiments are within the scope of the disclosure.

What is claimed is:

1. A semiconductor structure, comprising:
a semiconductor chip having a substrate layer and an active layer over the substrate layer, the active layer comprising:
a surface to an opposite end of the substrate layer;
a microelectronic element; and
a metallization layer retracted from the surface and over the microelectronic element, electrically connected to the microelectronic element, and a portion of the metallization layer being exposed from the surface through an opening;
an oxide layer filling the opening; and
a fusion bond interface connecting a substrate and the semiconductor chip at an interface of the oxide layer and the substrate.

2. The semiconductor structure of claim 1, wherein the semiconductor chip comprises an optical sensor, a fingerprint sensor or an LED.

3. The semiconductor structure of claim 1, wherein the substrate comprises glass, ceramic or sapphire.

4. The semiconductor structure of claim 1, wherein the substrate has a rectangular shape.

5. The semiconductor structure of claim 1, wherein the oxide layer comprises $SiO_2$, SiON or SiC.

6. The semiconductor structure of claim 1, wherein the oxide layer is about 0.1 micron to about 2 micron thick.

7. A semiconductor structure, comprising:
a semiconductor workpiece, comprising:
a substrate layer; and
an active layer over the substrate layer, the active layer comprising:
a surface to an opposite end of the substrate layer;
a microelectronic element; and
a metallization layer retracted from the surface and over the microelectronic element, electrically connected to the microelectronic element, and a portion of the metallization layer being exposed from the surface through an opening;
a light-transmissive substrate;
a bonding material filling the opening of the active layer of the semiconductor workpiece; and
a fusion bond interface connecting the light-transmissive substrate and the semiconductor workpiece at an interface of the bonding material and the light transmissive substrate.

8. The semiconductor structure of claim 7, wherein the semiconductor workpiece comprises an optical sensor.

9. The semiconductor structure of claim 7, wherein the semiconductor workpiece comprises a fingerprint sensor.

10. The semiconductor structure of claim 7, wherein the light-transmissive substrate is transparent to a wavelength range of from about 300 nm to about 700 nm.

11. The semiconductor structure of claim 7, wherein the bonding material comprises oxides.

12. The semiconductor structure of claim 7, wherein the bonding material comprises $SiO_2$, SiON or SiC.

13. The semiconductor structure of claim 7, further comprising a back surface of the substrate layer opposite to the active layer, the back surface including a metal pad electrically connected to a conductive via in the substrate layer.

14. The semiconductor structure of claim 13, further comprising a passivation layer over the back surface of the substrate layer, surrounding and partially covering the metal pad.

15. A semiconductor package, comprising:
a semiconductor workpiece configured to receive optical signal; the semiconductor workpiece comprising:
a substrate layer;
an active layer at an active side of the substrate layer, the active layer comprising:
a surface to an opposite end of the substrate layer;
a microelectronic element; and
a metallization layer retracted from the surface and over the microelectronic element, electrically connected to the microelectronic elements, and a portion of the metallization layer being exposed from the surface through an opening;
a metal pad at a passive side of the semiconductor workpiece substrate layer; and a conductive via electrically connecting the microelectronic element and the metal pad;
a substrate transmissive to the optical signal bonded to the active layer of the semiconductor workpiece;
a bonding material filling the opening; and
a fusion bond interface connecting the semiconductor workpiece and the substrate transmissive to the optical signal at an interface of the bonding material and the substrate transmissive to the optical signal.

16. The semiconductor package of claim 15, wherein the semiconductor workpiece comprises a plurality of semiconductor dies.

17. The semiconductor package of claim 15, wherein the metal pad is configured to electrically coupling an external electrical contact from the passive side to the microelectronic element.

\* \* \* \* \*